United States Patent [19]

Mihalich

[11] 4,240,039
[45] Dec. 16, 1980

[54] MOS DIFFERENTIAL AMPLIFIER

[75] Inventor: Stephen K. Mihalich, Santa Clara, Calif.

[73] Assignee: National Semiconductor Corporation, Santa Clara, Calif.

[21] Appl. No.: 47,450

[22] Filed: Jun. 11, 1979

[51] Int. Cl.³ .......................... H03F 3/45; H03F 3/16
[52] U.S. Cl. .................................. 330/253; 330/257; 330/277
[58] Field of Search ................. 330/253, 257, 277

[56] References Cited

PUBLICATIONS

Hoffman, C. R., "Common-Mode Translator for a Differential Signal Using MOSFET Technology," *IBM Tech. Disclosure Bull.*, vol. 21, No. 4, Sep., 1978, pp. 1590–1592.

*Primary Examiner*—Alfred E. Smith
*Assistant Examiner*—T. N. Grigsby
*Attorney, Agent, or Firm*—Gail W. Woodward; James A. Sheridan

[57] ABSTRACT

An amplifier having a differential input provides high gain, good common mode rejection, and linear response uses MOS transistors in a conventional integrated circuit construction. The circuit consists of four direct coupled stages, each one including a depletion and an enhancement transistor. The enhancement transistors are cascaded to provide a high gain common source connected amplifier. The depletion transistors in the four stages are alternately driven from the differential input terminals. This configuration provides a common mode range that can exceed the supply voltage by a wide margin. The differential response is linear and displays high gain. The common mode signal rejection is substantial. The circuit operates over a very wide range of supply voltages.

5 Claims, 3 Drawing Figures

U.S. Patent  Dec. 16, 1980  4,240,039
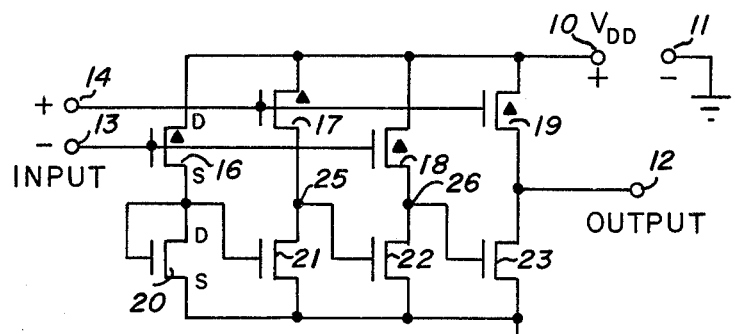
Fig_1
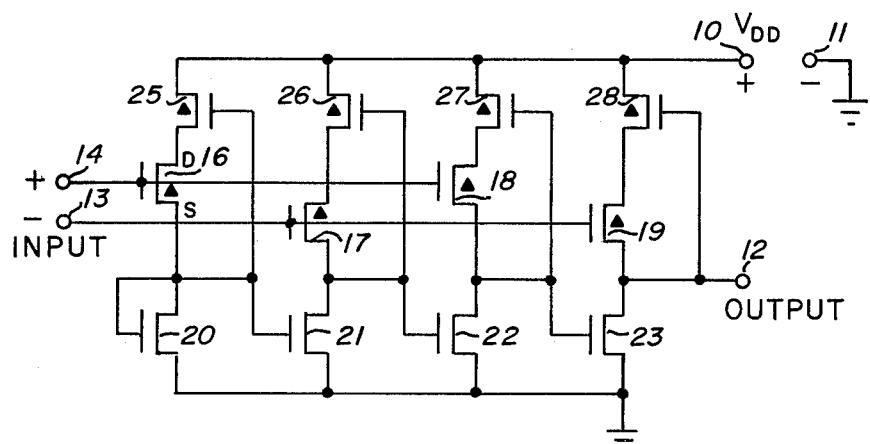
Fig_2
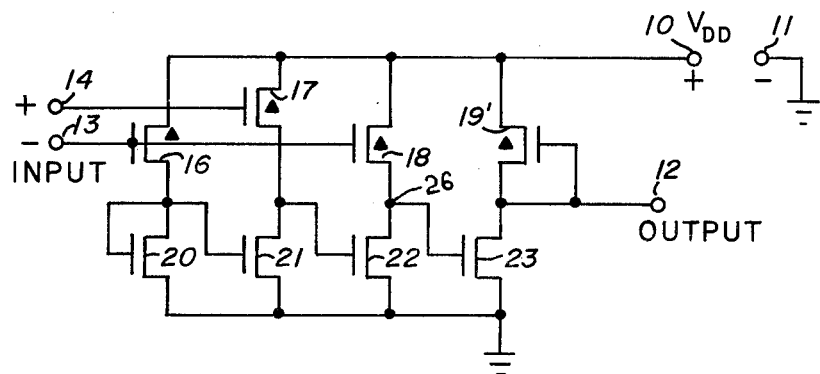
Fig_3

MOS DIFFERENTIAL AMPLIFIER

BACKGROUND OF THE INVENTION

Linear amplifiers have proven difficult to achieve using metal oxide semiconductor (MOS) devices. However, the MOS approach to integrated circuit (IC) construction has proven to be so effective that it has become one of the dominant construction forms. Since it would be desirable to incorporate linear amplifiers into MOS IC devices, many circuit approaches have been tried. The most common approach to differential amplifier design uses a circuit configuration very similar to the long-tailed pair construction well known in the bipolar transistor art. In the MOS version a pair of enhancement transistors are coupled to a pair of depletion load devices from which the output is derived. The enhancement transistors are differentially driven from the input and their sources are coupled to a common tail current source. In such a circuit the common mode range is restricted and the power supply potential must exceed two thresholds.

SUMMARY OF THE INVENTION

It is an object of the invention to provide a differential MOS amplifier that has a very large common mode range.

It is further object of the invention to provide a high gain linear amplifier suitable for MOS IC construction and capable of operating over a wide supply voltage range.

These and other objects are achieved in a circuit configured as follows. A four stage direct coupled configuration is employed. Each stage comprises series connected depletion and enhancement transistors. Their juncture mode comprises the stage output and the depletion transistor gate provides the stage input. In the first stage the enhancement transistor has its gate coupled to its drain and it acts as the load element for the depletion transistor which acts as a source follower driven by one input terminal. The first stage drives the gate of the second stage enhancement transistor. The second stage depletion transistor is driven from the second input terminal. Thus, the first two stages are driven in push-pull and have a common output which drives the gate of the third stage enhancement transistor. The third stage depletion transistor is driven in parallel with the first stage. The third stage output drives the gate of the fourth stage enhancement transistor and the fourth stage depletion transistor is driven in parallel with the second stage. If the depletion transistors are contructed to match each other and to have a higher threshold voltage than the enhancement transistors, which also match each other, the amplifier will have a common mode range that extends from below the source potential of the enhancement transistors which are coupled to one power supply rail to well in excess of the drain potential of the depletion transistors which are coupled to the other power supply rail. Thus, the common mode range greatly exceeds the power supply span. Additionally, the circuit will operate at a supply potential as low as one enhancement transistor threshold and up to the breakdown potential of the devices.

Alternative circuit embodiments include a cascode depletion transistor configuration and an open loop version in which only the first three stages are input driven.

BRIEF DESCRIPTION OF THE DRAWING

FIG. 1 is a schematic diagram of the the preferred circuit of the invention;

FIG. 2 is a circuit embodiment in which a cascode depletion transistor configuration is employed; and FIG. 3 is a circuit embodiment in which only the first three stages are driven to provide an open loop output stage configuration.

DESCRIPTION OF THE INVENTION

In the following discussion N channel MOS transistors will be described. However, P channel MOS devices could be used as well, provided that the power supply polarity is reversed. In a typical N channel IC construction the enhancement transistors usually have a threshold voltage of about 1 volt. The depletion transistors usually have a threshold voltage of about $-3$ volts. Thus in a depletion transistor, which is normally on, the gate potential must be about 3 volts or more below the source potential to turn it off. In the circuits to be described, it is preferred that the depletion threshold be greater than the enhancement threshold. These transistor characteristics are typical of the conventional MOS technology.

FIG. 1 shows the basic circuit of the invention. The $V_{DD}$ power supply is connected to the positive rail at terminal 10 and to the negative rail (ground) at terminal 11. Terminal 12 constitutes the amplifier output. Terminals 13 and 14 constitute the inverting and noninverting inputs respectively.

Transistors 16–19 are depletion devices alternately driven from the differential input terminals 13 and 14. These transistors should all be of the same size and should have matched characteristics. Transistors 20–23 are enhancement transistors and should all be of the same size so as to have matched characteristics. Transistors 16 and 20 are series connected across the supply rails with the source drain electrodes connected as shown. Since this connection configuration is repeated in all of the transistor circuits, this convention will not be repeated. The gate of transistor 20 is connected to its drain so that it will be turned on as long as the drain to source potential difference is equal to or greater than the device threshold voltage. Thus transistors 16 and 20 are driven from the inverting input as a source follower that drives the gate of transistor 21 with transistor 20 acting as the load. Transistors 17 and 21 are driven in push-pull from the differential input. Transistor 21 acts as an inverting stage while transistor 17 acts as a driven load device. Since transistor 21 acts as an inverter, the differential input is reinforced at node 25. However, it can be seen that common mode signals at terminals 13 and 14 will tend to cancel at node 25.

Transistors 18 and 22 comprise the next stage. Transistor 22 is driven from node 25 while load transistor 18 is driven from the inverting input terminal 13. Thus, they are driven in push-pull so that differential input signals again reinforce at node 26 while common mode input signals will tend to cancel.

Transistors 19 and 23 comprise the output stage. Inverting transistor 23 is driven from node 26 and its load transistor 19 is driven from noninverting input terminal 14. This stage too is driven in push-pull so that differential inputs reinforce at terminal 12 while common mode signals cancel.

Transistors 21, 22, and 23, operating as cascaded common source amplifiers, can provide substantial gain. Since their load transistors are driven in push-pull, there is considerable gain from different input terminals 13 and 14 to output terminal 12. Gain values of several hundred are easily achieved.

To illustrate the common mode operation, assume that terminals 13 and 14 are connected together and grounded. The current flowing in transistors 16 and 20 will seek a value that will set the potential at the source of transistor 16 so that it conducts sufficiently to turn transistor 20 on to conduct an equal current. Thus, the potential at the source of transistor 16 will operate at a value that lies between the threshold values of transistors 16 and 20. Since these values are typically 1 and 3 volts, the potential will typically be about 2 volts. The actual value will be determined largely by the device ratioing.

At this point it is clear that the input terminals can be operated slightly below ground and still have conduction in transistors 16 and 20. However, assuming the above threshold voltages, if the gate of transistor 16 goes, more than about 2 volts negative, one of the transistors will start to turn off.

Now assume that terminals 13 and 14 are both connected to $+V_{DD}$ at the positive rail. This raises the gate to source potential on transistor 16 and makes it conduct more heavily and it will attempt to pull its source up. However, this would raise the gate potential on transistor 20 so as to raise its current which will pull the source of transistor 16 down. If transistor 20 is a high gain device, its drain to source potential will vary only a small amount. Thus, as the common input voltage goes from ground to $+V_{DD}$ the current in transistors 16 and 20 will increase but the potential across transistor 20 will change only slightly.

In terms of the common mode, it can be seen that each stage will react similarly. The gate of transistor 21 is connected to the drain of transistor 20. Since transistors 20 and 21 are matched, their collector potentials will be the same. This consideration is repeated through transistors 22 and 23 to output terminal 12. However, there is substantial gain with three inversions from the gate of transistor to the output terminal. Thus, any variation in potential at the gate of transistor 20 will be amplified and inverted at terminal 12 so as to drive the source of transistor 19 to cancel the effect of its gate drive from terminal 14. This means that at terminal 12 there will be very little common mode response.

At this point it can be seen that terminals 13 and 14 can actually operate above $+V_{DD}$ with little output reaction. This means that the circuit has a common mode range that extends from below the negative rail to substantially above the positive rail.

In the circuit configuration shown it can be seen that in order to turn transistor 20 on its source to drain potential must be one threshold or greater. Since this value is less than the threshold voltage of transistor 16, the circuit will be operative at supply potentials as low as one enhancement device threshold. This is about one half of the low voltage limit of prior art circuits. The upper operating voltage limit will be determined by the PN junction diode breakdown value of the devices. For typical MOS IC devices this will be from 5 to several tens of volts.

FIG. 2 shows an alternative circuit embodiment. The parts of FIG. 1 are employed and are shown with the same designations. However, each depletion transistor has a second depletion transistor from the group 25–28 connected in series therewith. The gates of the series connected transistors are connected to the source electrodes of transistors 16–19. This cascode connection provides additional control of the current in the depletion transistors. For example, referring to transistors 16 and 25, it can be seen that as transistor 16 is made more conductive it will try to pull its source potential up. This will tend to raise the gate potential on transistor 25 and simultaneously pull the source of transistor 25 down. This renders transistor 25 more conductive. Thus, the conductivity of both transistors will be varied in the same direction and the circuit action thereby enhanced. Otherwise the circuit of FIG. 2 operates in substantially the same manner as the circuit of FIG. 1.

FIG. 3 shows a modified version of the circuit of FIG. 1. All of the circuit elements carry the same designation except for transistor 19'. Here the transistor gate is returned to its source rather than to the noninverting input. This causes transistor 19' to act as a simple load resistor which is the conventional depletion load operation. Thus the conduction in transistor 19' is determined solely by the conduction in transistor 23 which operates as a simple high gain inverter from node 26. Otherwise the operation of the circuit of FIG. 3 is substantially the same as that of FIG. 1.

EXAMPLE

The circuit of FIG. 1 was fabricated in conventional P channel MOS IC form. The W/L ratio (in mils) for transistors 16–19 was made 0.6/1 and for transistors 20–23 was made 4/0.6. The common mode rejection at the output terminal was in excess of 56 db and the differential gain was about 50 db. The common mode range for a $V_{DD}$ of 5 volts extended from about +1 to over −20 volts. The circuit functioned using a power supply voltage equal to the enhancement transistor threshold voltage (about 1 volt). The circuit functioned well at all power supply voltages up to the typical PN junction diode breakdown limit.

The invention has been described and alternatives detailed. An operating example of a functioning embodiment has been shown. There are other alternatives and equivalents that will occur to a person skilled in the art. For example, the circuit of FIG. 1 could be expanded by cascading an additional pair of stages similar to the section including transistors 18, 19, 22 and 23. Accordingly, it is intended that the scope of the invention be limited only by the claims that follow.

I claim:

1. A linear differential amplifier circuit having first and second differential input terminals and an output terminal, said circuit being adapted for MOS construction and comprising:

first and second supply rails connectible to a source of operating potential;

first, second, third and fourth stages, each of which comprises a depletion transistor connected in series with an enhancement transistor, the juncture thereof providing a stage output node, said depletion transistor having a drain electrode coupled to said first rail and said enhancement transistor having a source electrode coupled to said second rail;

means for coupling the gate electrode of said enhancement transistor in said first stage to said output node of said first stage;

means for coupling the gate electrode of said enhancement transistor of said second stage to said output node of said first stage;

means for coupling the gate electrode of said enhancement transistor of said third stage to said output node of second stage;

means for coupling the gate electrode of the enhancement transistor of said fourth stage to said output node of said third stage, said output node of said fourth stage providing said output terminal of said amplifier circuit;

means for coupling said first input terminal to the gate electrodes of the depletion transistors in said second and fourth stages; and means for coupling said second input terminal to the gate electrodes of said depletion transistors in said first and third stages.

2. The circuit of claim 1 wherein all depletion transistors are matched to each other and enhancement transistors are matched to each other.

3. The circuit of claim 2 wherein said depletion transistors have a greater absolute value threshold voltage than said enhancement transistors.

4. The circuit of claim 3 wherein each of said stages further comprises an additional depletion transistor with its source drain electrodes coupled between said first rail and said depletion transistor and its gate coupled to said stage output node.

5. The circuit of claim 3 wherein said first input terminal is coupled only to said gate of said depletion transistor in said second stage and the gate of said depletion transistor of said fourth stage is coupled to said circuit output terminal.

* * * * *